United States Patent [19]

Carter et al.

[11] Patent Number: 5,252,506
[45] Date of Patent: Oct. 12, 1993

[54] METHOD TO ELIMINATE GATE FILAMENTS ON FIELD PLATE ISOLATED DEVICES

[75] Inventors: Duane E. Carter; William R. McKee, both of Plano; Gishi Chung, Dallas; Fred D. Fishburn, Richardson, all of Tex.

[73] Assignee: Texas Instruments Incorporated, Dallas, Tex.

[21] Appl. No.: 879,697

[22] Filed: May 5, 1992

Related U.S. Application Data

[63] Continuation of Ser. No. 633,587, Dec. 20, 1990, abandoned.

[51] Int. Cl.⁵ ............................................ H01L 21/306
[52] U.S. Cl. ...................................... 437/47; 437/48; 437/52; 437/238
[58] Field of Search ...................................... 437/43

[56] References Cited

U.S. PATENT DOCUMENTS 4,888,298  12/1989  Rivaud et al. ................... 437/43

FOREIGN PATENT DOCUMENTS 63-43351  2/1988  Japan ................................ 437/43

Primary Examiner—Olik Chaudhuri
Assistant Examiner—Ourmazd S. Ojan
Attorney, Agent, or Firm—Stanton C. Braden; Richard L. Donaldson; William E. Hiller

[57] ABSTRACT

A method is disclosed for preventing formation of undesirable polysilicon word line gate filaments in integrated circuit devices such as VLSI dynamic random access memories employing field plate isolation. Before the word lines are processed, an oxide layer is formed in the field plate openings beneath sidewalls of nitride along the edges of the field plate openings. The oxide layer partially fills an undercut area beneath a dip out of the sidewall of nitride. The dip out of the sidewall of nitride is removed. The removal of the dip out and the partial filling of the undercut area reduces the possibility of polysilicon word line filaments from forming around the edge of the field plate openings in the undercut area when the word lines are later added. A field plate isolated memory device is also disclosed wherein along the edges of the field plate openings, the partially filling oxide layer and the sidewall nitride layer are approximately coincident.

19 Claims, 14 Drawing Sheets

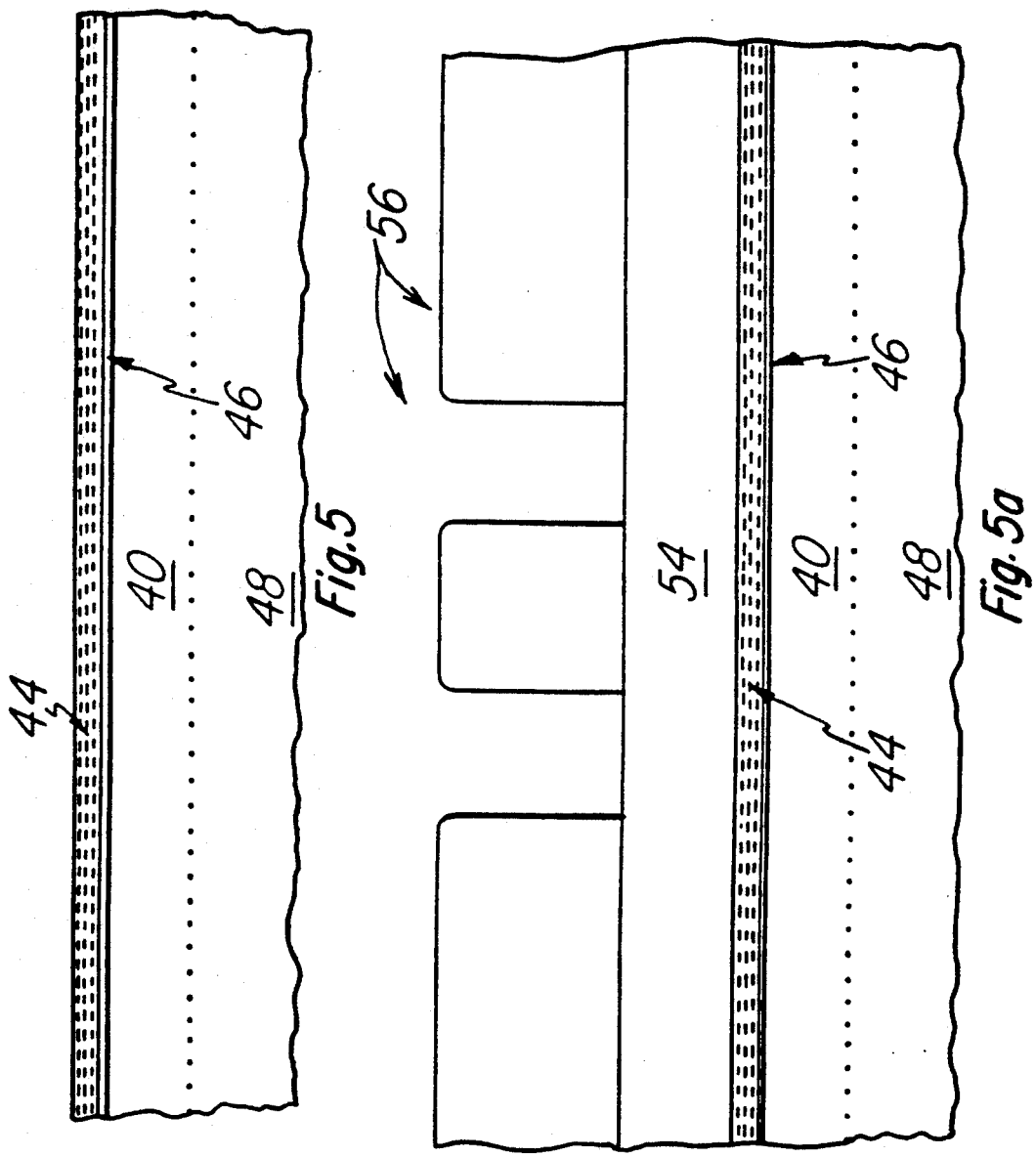

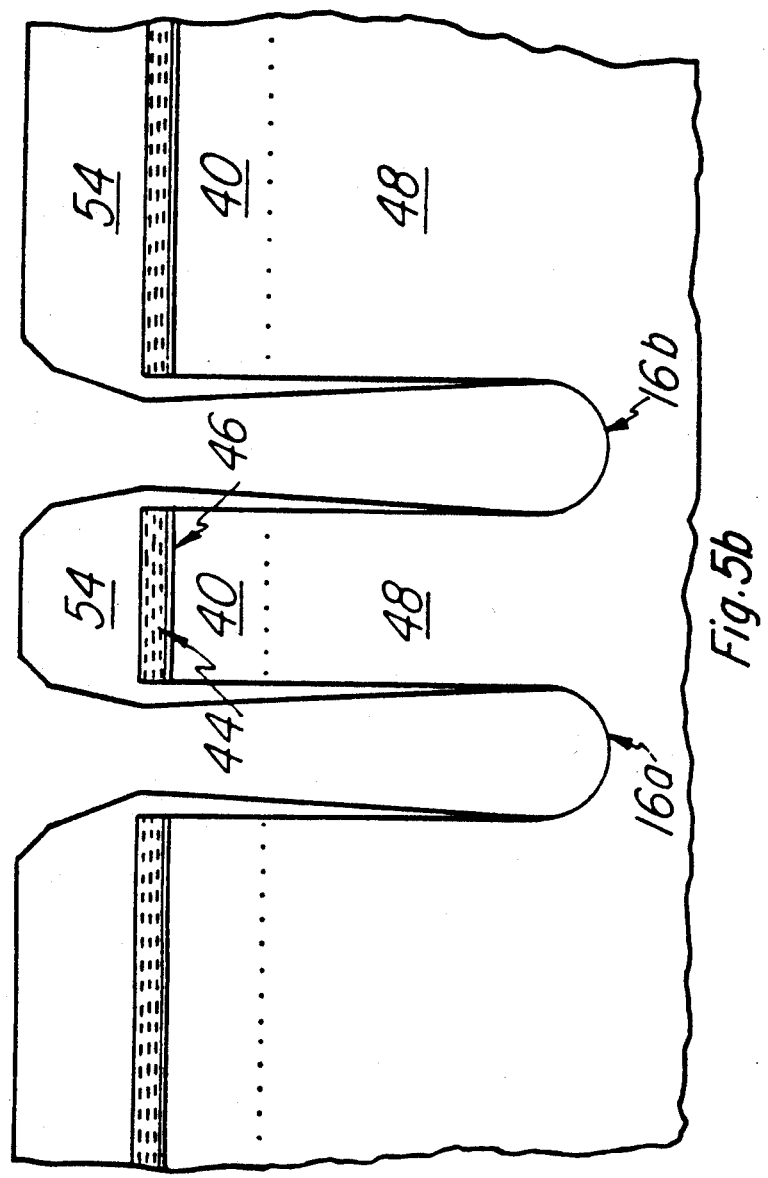

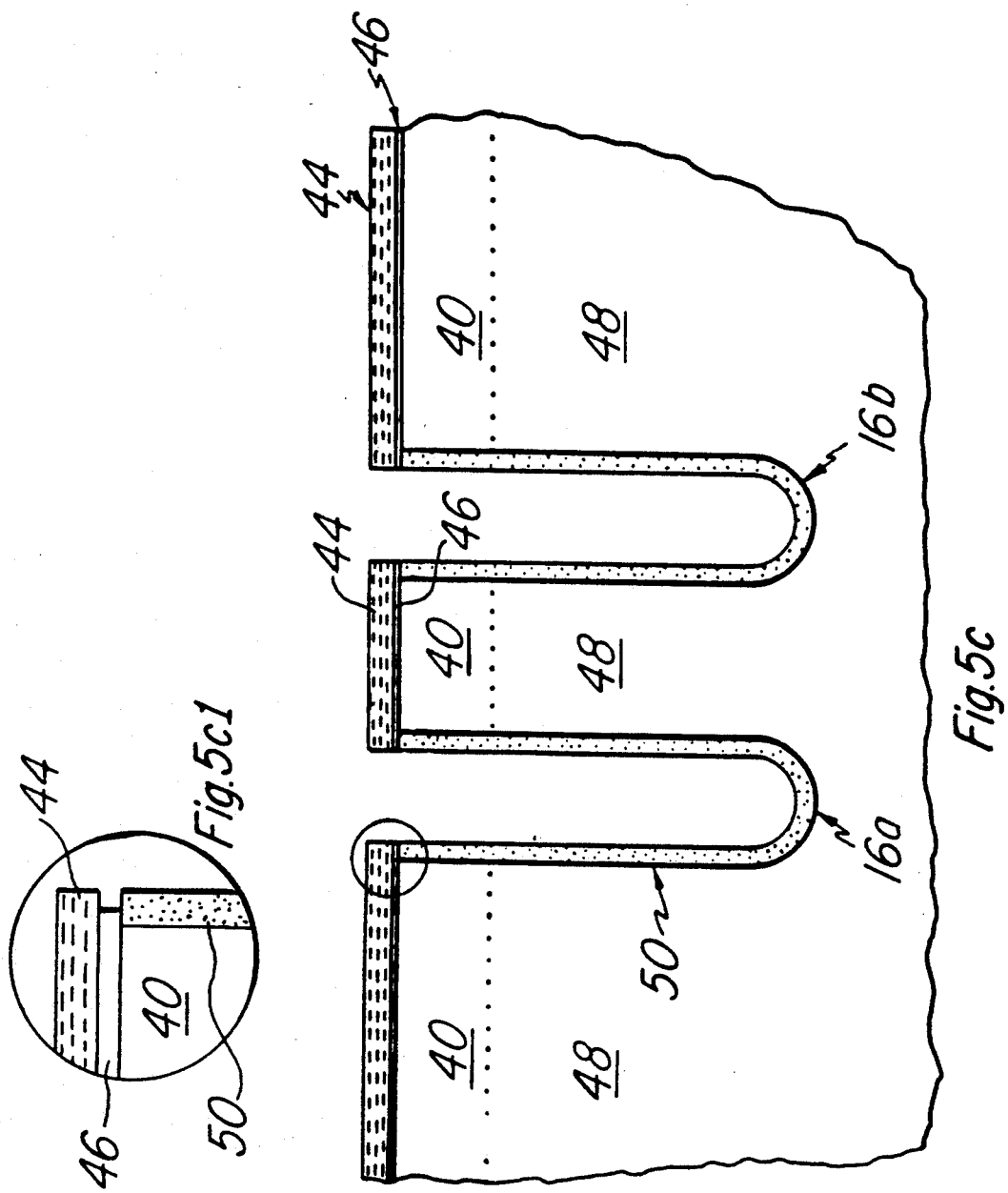

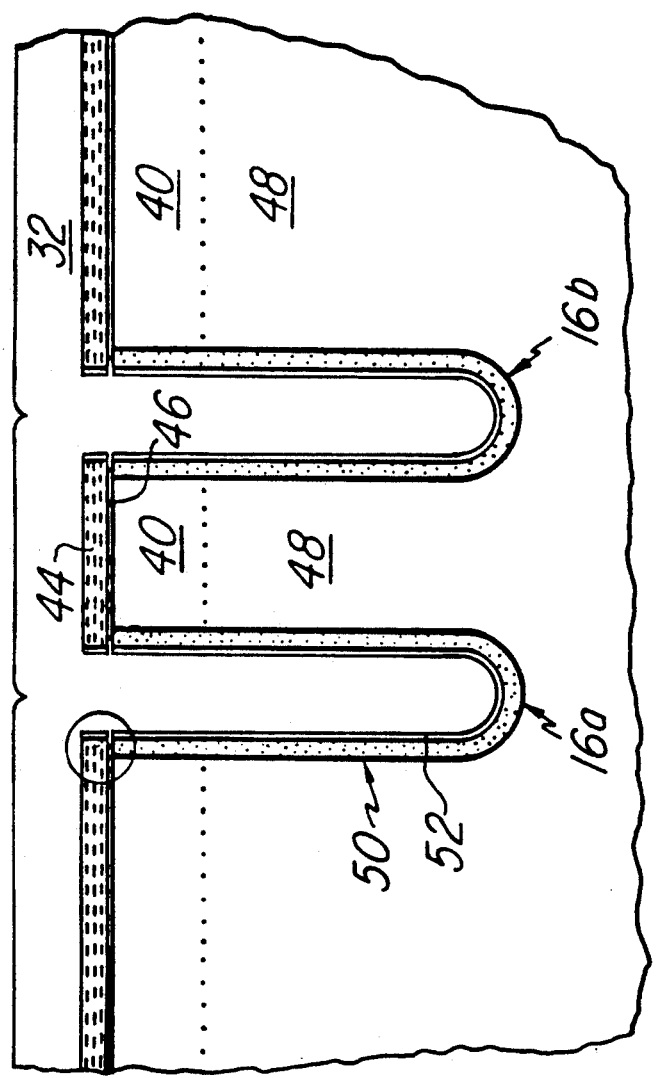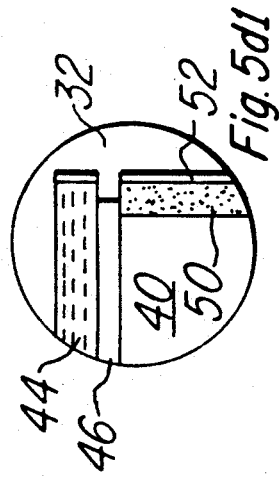

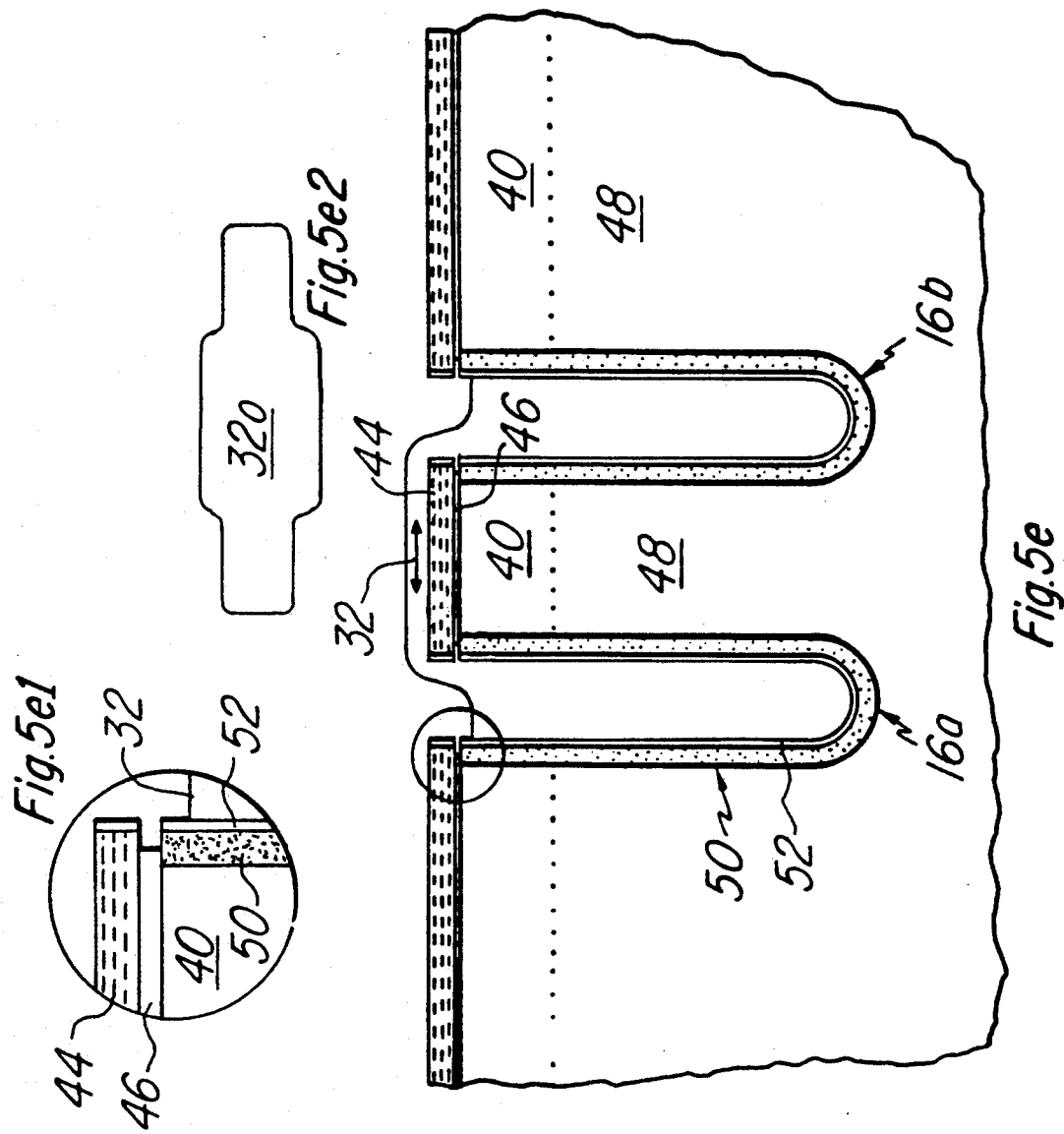

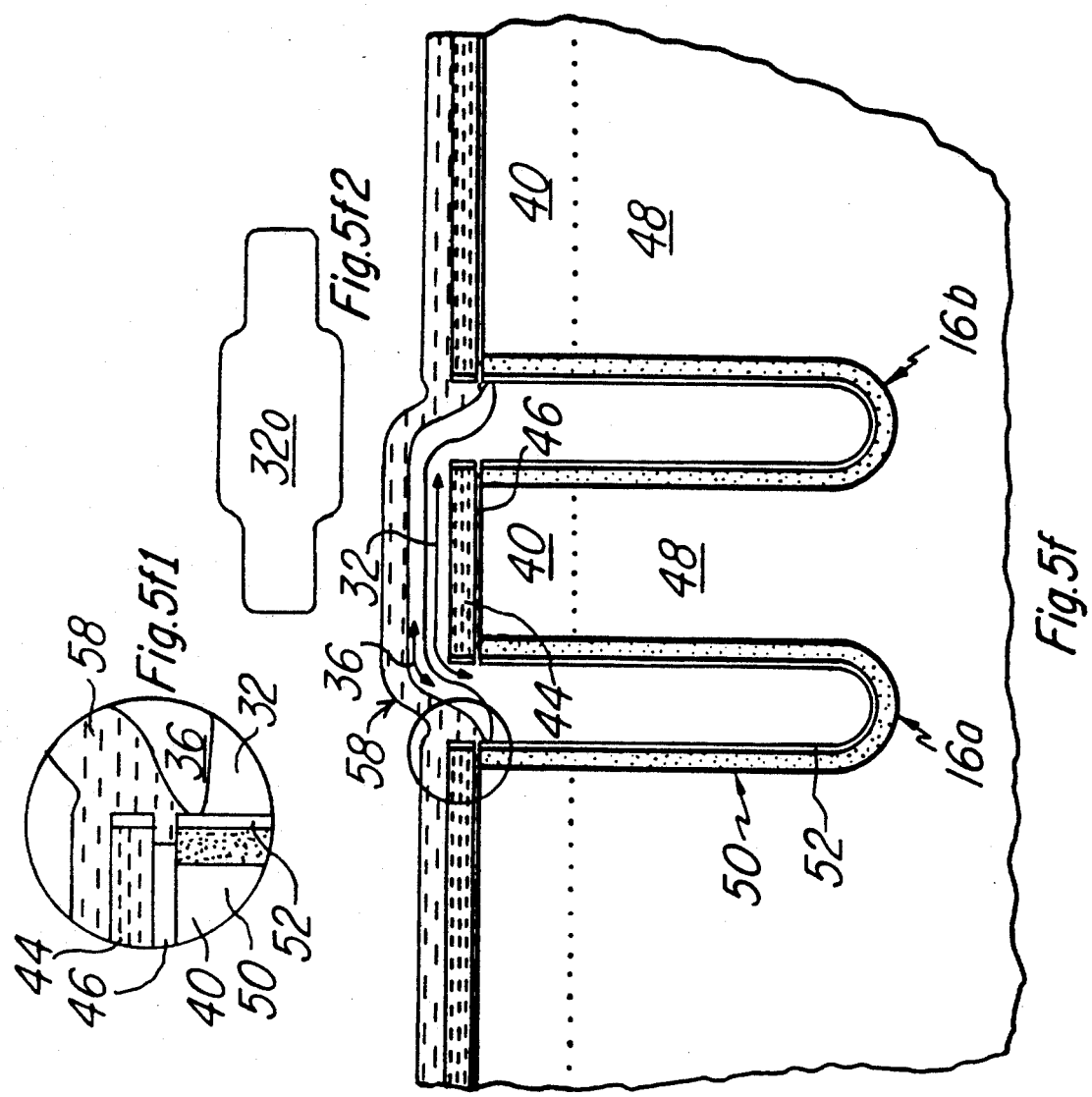

Fig.5g1

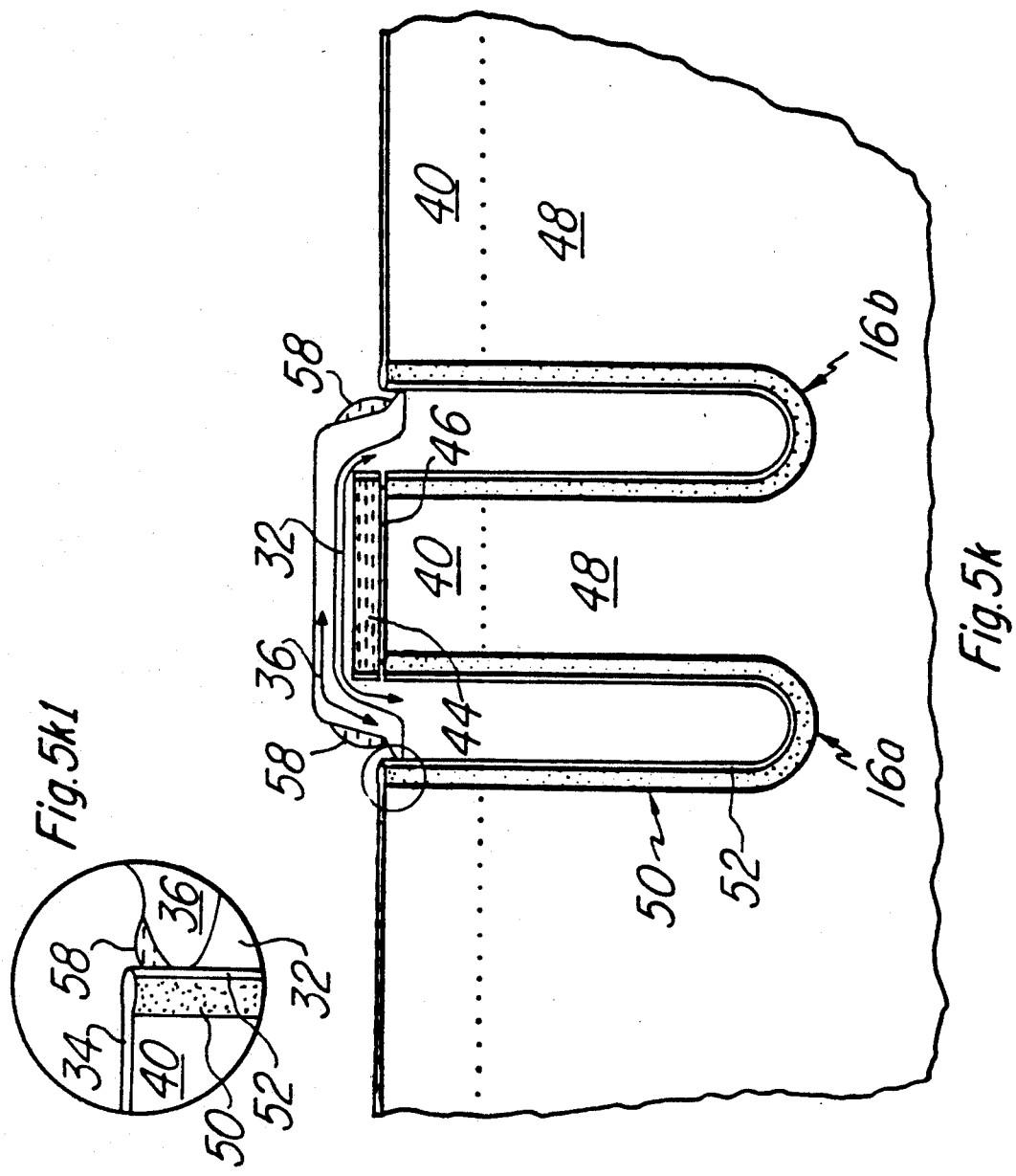

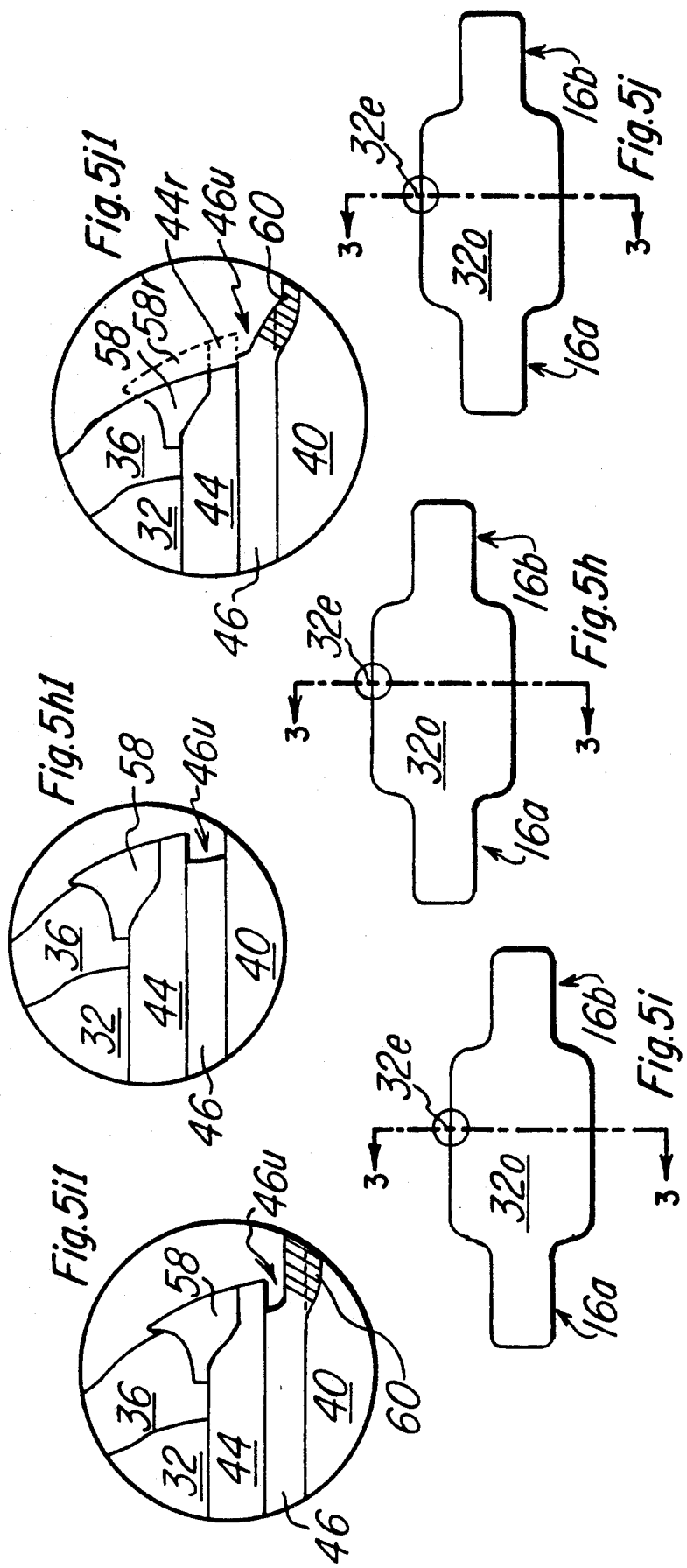

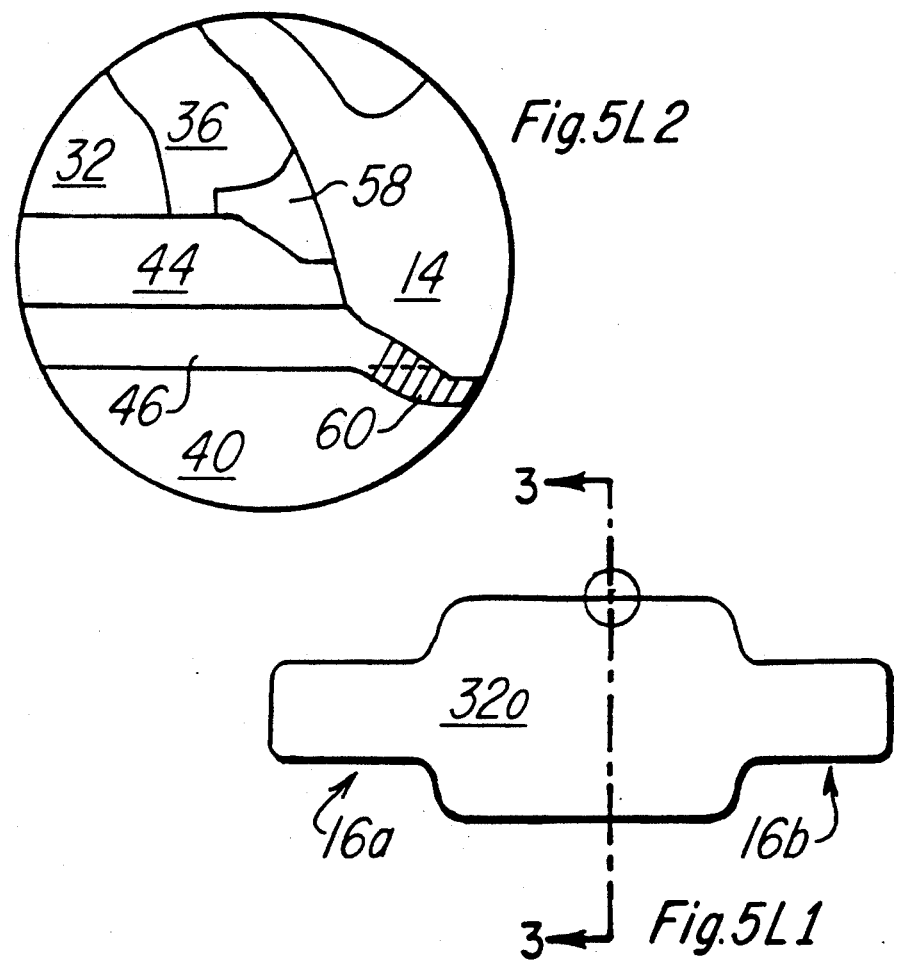

METHOD TO ELIMINATE GATE FILAMENTS ON FIELD PLATE ISOLATED DEVICES

This application is a continuation of application Ser. No. 07/633,587, filed Dec. 20, 1990, now abandoned.

FIELD OF THE INVENTION

The present invention relates to the field of integrated circuits and more specifically to integrated circuit memory devices utilizing field plate isolation.

BACKGROUND OF THE INVENTION

The quest to develop larger and larger semiconductors of the dynamic random access memory (DRAM) type is a well known goal. The industry has steadily progressed from DRAMs of the 16K type, shown in U.S. Pat. No. 4,081,701 issued to White, McAdams and Redwine, and the 64K type, shown in U.S. Pat. No. 4,055,444 issued to Rao, to DRAMs of the 1M type, as described in U.S. Pat. No. 4,658,377 issued to McElroy. DRAMs of the 4M type are now being produced. Production plans for 16M DRAMs of submicron technology now exist and experimentation of 64M DRAMs has begun. One factor furthering the development of larger DRAMs is the reduction in memory cell geometries as illustrated in U.S. Pat. No. 4,240,092 to Kuo (a planar capacitor cell), and as illustrated in U.S. Pat. No. 4,721,987 to Baglee et al. (a trench capacitor cell). The trench capacitor cell of Baglee describes it's upper plate as a polysilicon layer extending into the trench. This polysilicon layer extends over the face of the silicon bar to form field plate isolation over the face of the bar.

In developing submicron 16MB DRAMs of the trench capacitor type having field plate isolation, process engineers have encountered a potential shorting problem caused by undesirable polysilicon gate, poly si, filaments. During processing, these poly si filaments sometimes can remain around the field plate openings. The polysilicon word lines, that also act as the gate electrodes for the pass gate transistors, lie in close proximity to the edge of the field plate openings. The poly si filaments can extend into the polysilicon word lines and thereby cause shorting between adjacent polysilicon gate electrodes. Another undesirable effect of poly si filaments is a contribution to low gate breakdown voltages.

It is the object of this invention to provide a method to eliminate undesirable polysilicon gate filaments on field plate isolated devices such as high density dynamic random access memories.

Other objects and advantages of the invention will be apparent to those of ordinary skill in the art having reference to the following specification, together with the drawings.

SUMMARY OF THE INVENTION

A method is disclosed for preventing formation of undesirable polysilicon word line gate filaments in integrated circuit devices such as VLSI dynamic random access memories employing field plate isolation. Before the word lines are processed, an oxide layer is formed in the field plate openings beneath sidewalls of nitride along the edges of the field plate openings. The oxide layer partially fills an undercut area beneath a dip out of the sidewall of nitride. The dip out of the sidewall of nitride is removed. The removal of the dip out and the partial filling of the undercut area reduces the possibility of polysilicon word line filaments from forming around the edge of the field plate openings in the undercut area when the word lines are later added. A field plate isolated memory device is also disclosed wherein along the edges of the field plate openings, the partially filling oxide layer and the sidewall nitride layer are approximately coincident.

DETAILED DESCRIPTION OF THE PREFERRED EMBODIMENT

Figure 1:
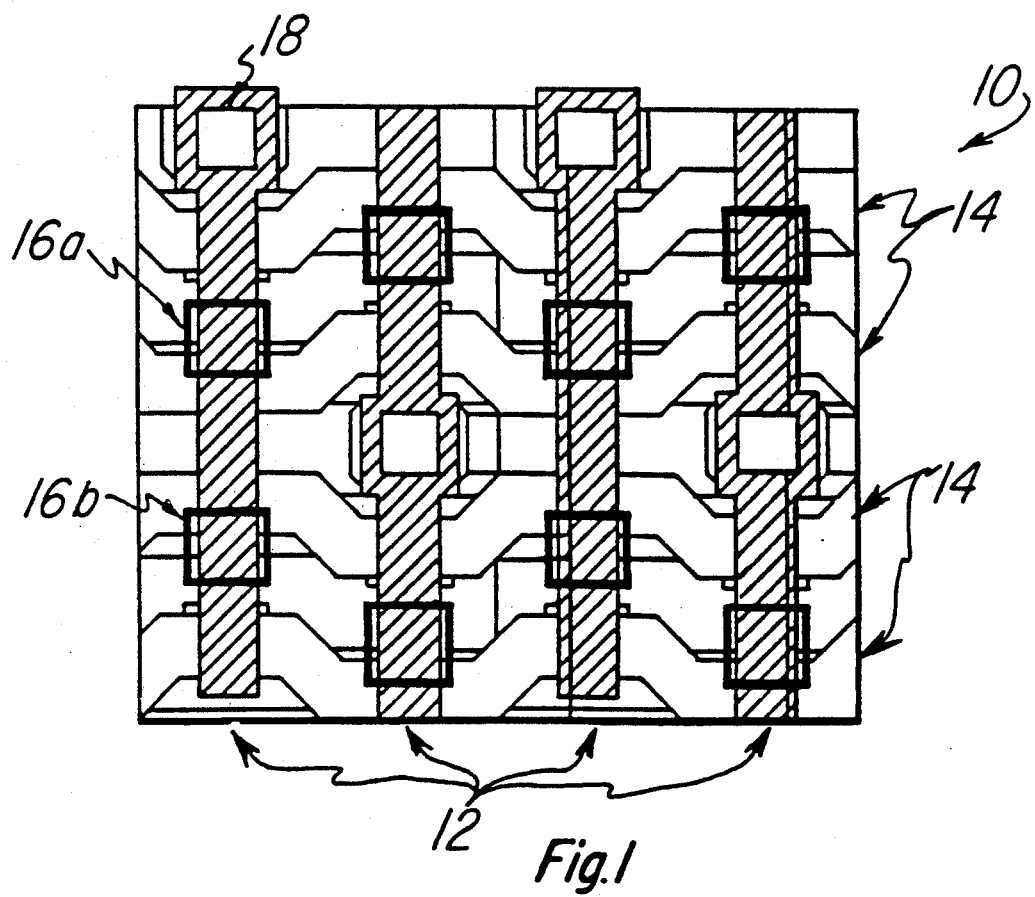
FIG. 1 is a top view of a portion of the memory array of a dynamic random access memory device, DRAM.

FIG. 1 illustrates a top view of a portion of a DRAM 10 memory array. The DRAM 10 may be a VLSI memory device of the so called 16 megabit size containing more than sixteen million memory cells on a single semiconductor substrate. The device contains bit lines 12 of poly-3 ($TiSi_2$) polycide, triple twisted for noise immunity. The word lines 14 are segmented poly-2, are strapped every 64 bits with metal-2. The DRAM 10 lays out the bit lines 12 and the word lines 14 in about a 1.6 um bit line pitch by about a 3.0 um double word line pitch pattern. The trench capacitors 16a and 16b contain a trench opening of about 0.8 um by 0.8 um, a trench to trench space of about 1.1 um, and a trench depth of about 6.0 um. The bit line contact 18 connects to a bit line 12 and to the drain of an unillustrated pass gate transistor 20.

Figure 2:
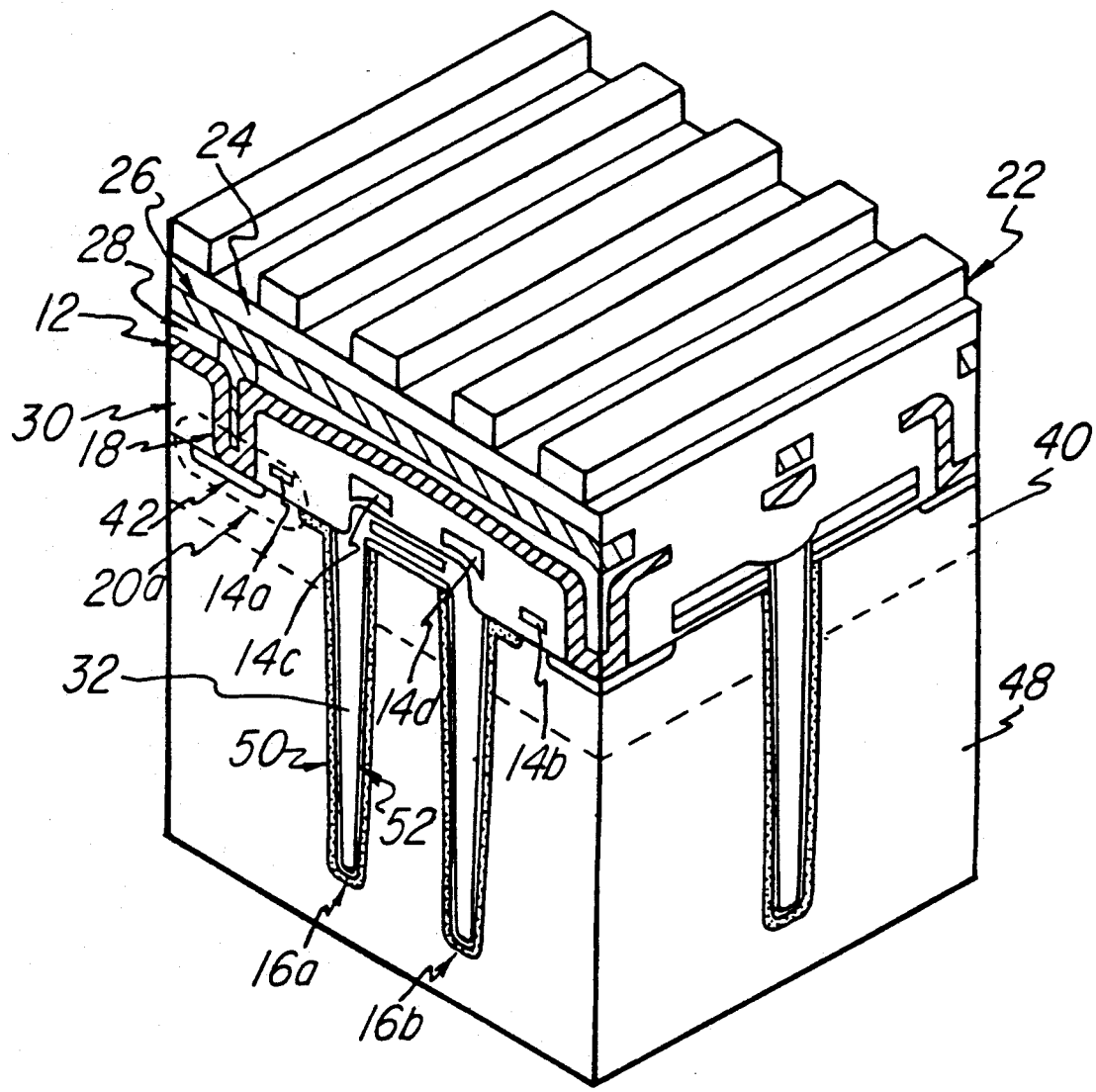
FIG. 2 is a three dimensional perspective view of a portion of the memory array of the DRAM of FIG. 1 containing the trench capacitors 16a and 16b.
Figure 3:
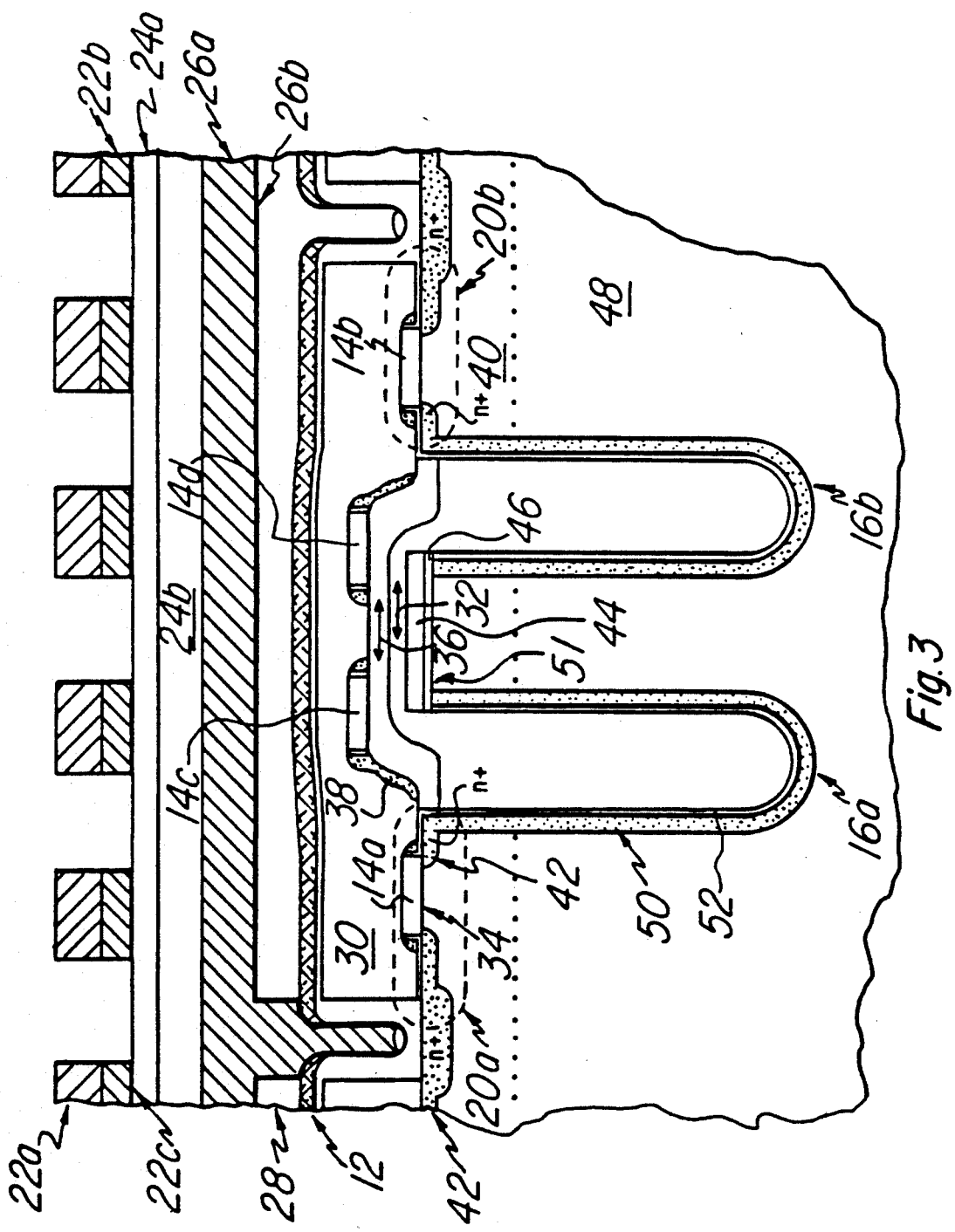
FIG. 3 is a cross sectional view of a portion of the memory array of the DRAM of FIG. 2 containing the trench capacitors 16a and 16b.

FIG. 2 presents a three dimensional view of a portion of FIG. 1 while FIG. 3 presents a cross section view. A three layer interconnect metal 22, Metal-2, accomplishes word line strapping. It has a top level 22a of Al-Si-Cu sputtered onto a middle level 22b of CVD W about 3500 A thick that overlies the bottom level 22C of sputtered TiW about 500 A thick. Oxide layer 24, lying beneath metal-2, is a metal interlevel oxide, MILO, of three layers: a top MILO level 24a of PECVD TEOS oxide about 3500 A thick; a middle level, unillustrated, of spin on glass, SOG; and, a lower MILO level 24b of PECVD TEOS oxide about 7000 A thick. A two level interconnect metal 26, Metal-1, lying beneath MILO-2 24 accomplishes contacts to bit lines. It's top layer 26a of chemical vapor deposited tungsten, CVD W, overlies it's bottom layer 26b of sputtered TiW. In an alternative embodiment, interconnect metal layer 26 could consist of reacted titanium nitride. A multilevel oxide layer 28, MLO, lies below interconnect metal 26 to provide isolation between the silicided Poly-3 bitlines and Metal-1. A bit line oxide layer 30, BLO, lies beneath bit line 18, between bit line 18 and Poly-2 word lines 14. The poly-2 word lines 14 are about 0.6 microns wide. Poly-2 word line 14a forms the gate of pass transistor 20a and poly-2 word line 14b forms the gate of the pass transistor 20b for trench capacitor 16b. They are separated from the substrate by a Gate-2 oxide layer 34 about 150 A thick. Poly-2 word lines 14c and 14d pass over the top trench capacitors 16a and 16b and connect to other trench capacitors not shown. They are separated from the Poly-1 field plate 32 by an interlevel oxide layer 36, ILO, of thermally grown oxide. The poly-2 word lines 14 have side walls 38 of deposited nitride-2. Phosphorus N+ implant layer lies in the P tank 40, located underneath the BLO layer 30 of the bit line contacts, and also located between word line 14a of trench capacitor 16a and between word line 14b of trench capacitor 16b. Phosphorous N+ implant layer 42 forms the drain and source of the pass transistors. Underneath the poly-1 field plate 32, between the trench to trench space separating trench capacitors 16a and 16b, lies a nitride layer 44, nitride-3, about 1300 A thick. Between Nitride-3 layer 44 and P-tank 40 lies an oxide layer 46, pad ox-3, containing about 300 A of oxide. It acts as a buffer layer between the Silicon substrate 48 and the nitride-3 layer 44 and as part of the field plate isolating dielectric.

Still referring to FIGS. 2 and 3, the trench capacitors 16a and 16b extend through the P-tank 40 into the P substrate 48 of the silicon wafer, not shown. On the outside of the trench capacitor walls, is an implanted layer 50 of arsenic. Arsenic layer 50 creates the N+ storage node of the trench capacitors. The trench capacitor walls contain a gate dielectric 52, gate ox-1, that acts as a dielectric layer between the arsenic trench wall implant and the poly-1 field plate 32. An oxide layer covers a thin nitride layer to form the gate dielectric layer 52.

Figure 4:
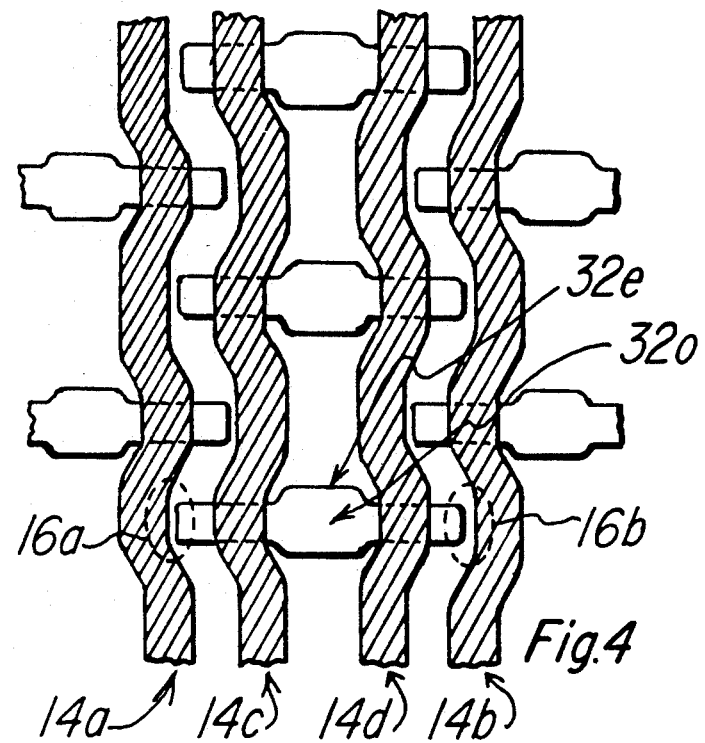
FIG. 4 is a top view of the portion of the memory array of FIGS. 2 and 3 illustrating the field plate opening over the trenches 16a and 16b and the related word lines.

FIG. 4 illustrates a top view of field plate opening 32o into the field plate 32 and the surrounding word lines 14a-14d. The field plate openings have an elliptical shape. The trenches 16a and 16b are located on opposite ends of the field plate opening 32o. If an undesirable polysilicon filament followed along the edge of the field plate opening, it could act as a conductor between word lines 14c and 14d. 32e depicts an edge of the field plate opening 32o. It provides a point of reference along the field plate edge for later FIGS.

Figure 5G:
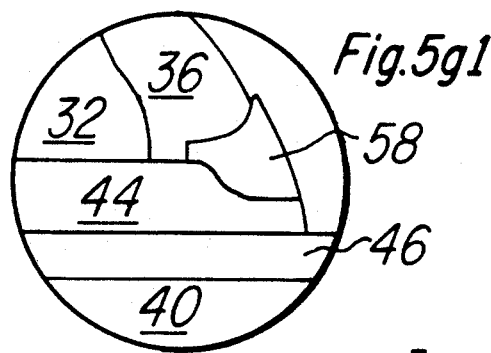
FIGS. 5–5m are mostly cross sectional views illustrating successive stages in the formation of the DRAM of FIG. 2; some top views of the field plate openings are included.
Figure 5G:
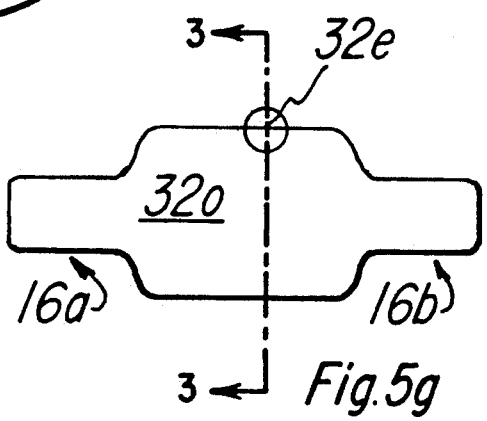
Figure 5L:
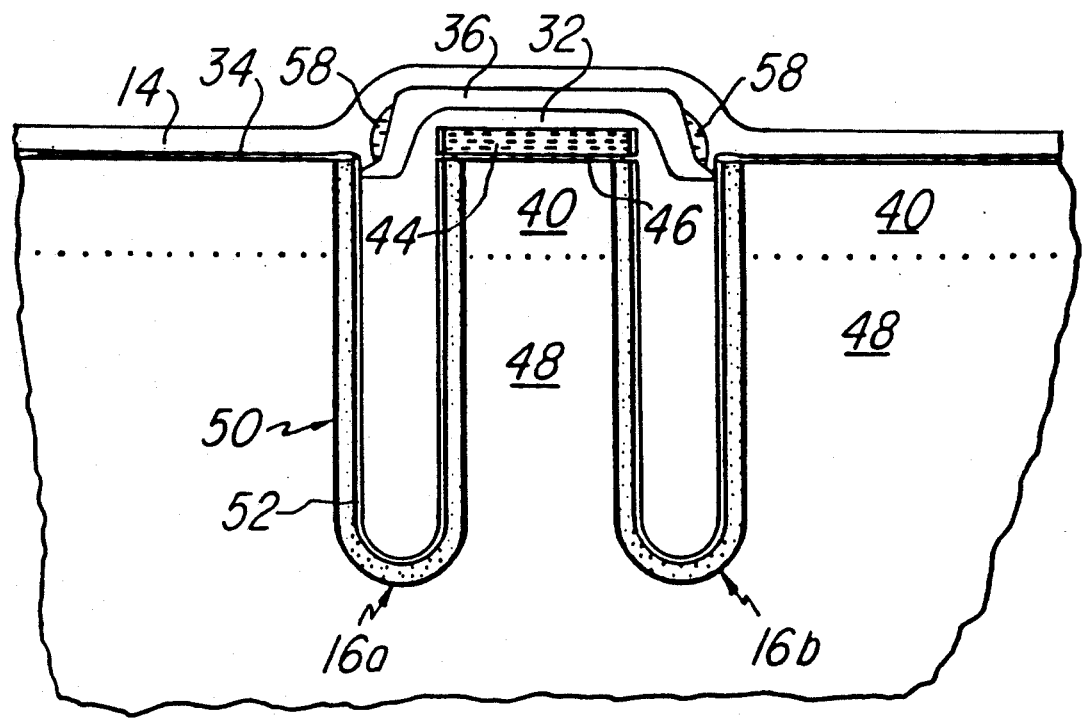
Figure 5M:
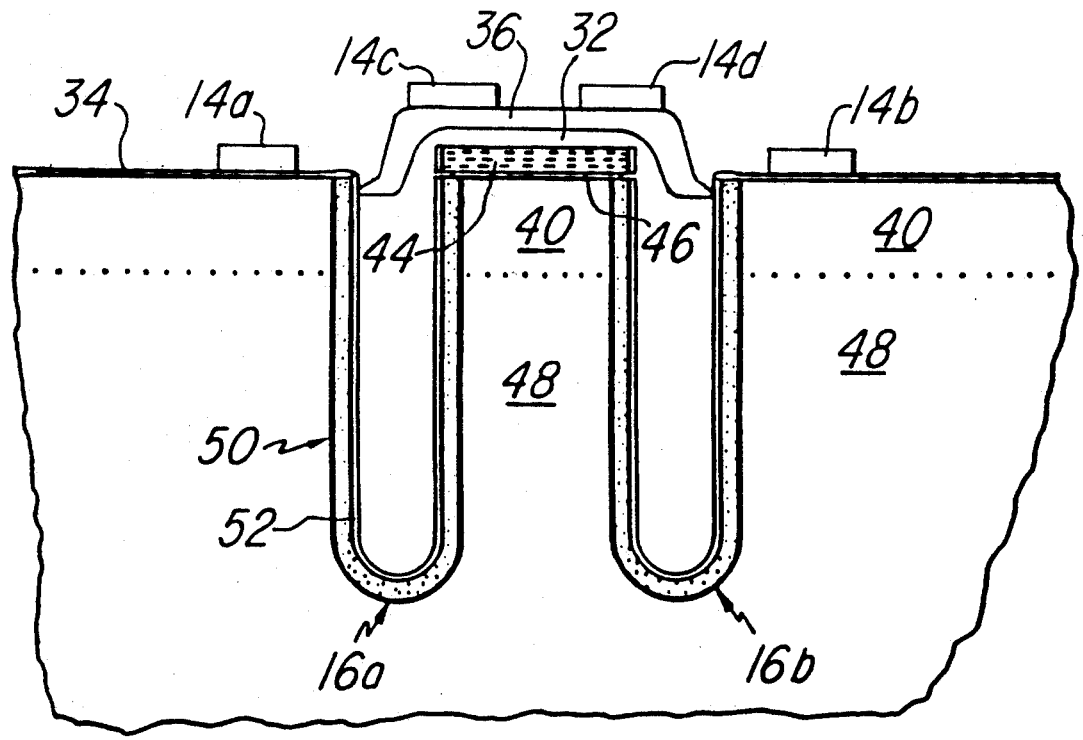

By reference to FIGS. 5-5m, this specification next describes the process for manufacturing the preferred embodiment of the above described DRAM 10 through the processing point that advantageously eliminates potential polysilicon word line filaments and through the point of forming the polysilicon word lines. U.S. Pat. No. 4,721,987 to Baglee et al. entitled "Trench Capacitor Process for High Density Dynamic Ram" issued Jan. 26, 1988 and assigned to Texas Instruments Incorporated describes an entire DRAM trench capacitor, field plate isolated, process flow and the following copending and coassigned applications of Texas Instruments Incorporated filed on Jul. 25, 1989, incorporated herein by reference, also fully describe process flows suitable for thereafter completing the manufacture of DRAMs having trench capacitors and field plate isolation similar to DRAM 10:

Ser. No. 385,341, now abandoned,
Ser. No. 385,601, now abandoned,
Ser. No. 385,328, now abandoned,
Ser. No. 385,344, now U.S. Pat. No. 5,017,506, and
Ser. No. 385,340, now U.S. Pat. No. 5,111,259

Referring to FIG. 5, a boron implant step creates P-tank 40 in P type silicon substrate 48. An implant step of about $6.0E12/cm^2$ boron @50 KeV suffices to increase the boron concentration in p-tank 40 for control of trench capacitance leakage and latchup. A steam/HCL oxidation step at about 900 C grows about 300 A of oxide on top of p-pad 40 to form pad oxide-3 layer 46. Pad oxide-3 layer 46 acts as a buffer between the silicon substrate 48 and nitride-3 layer 44. A deposition step of about 1DCS: 10NH$_3$, 200 mtorr, 800 C forms nitride-3 layer 44 to a thickness of about 1300 A on top of pad oxide-3 layer 46.

In FIG. 5a, a Phospho-Silicate Glass (PSG) deposition step of about 7.4 wt % phosphorus at 530 C creates a trench mask oxide 54 on top of nitride-3 layer 44. A trench pattern step of coating trench mask oxide layer 54 with photoresist 56, exposing and developing the photoresist 56 through the desired trench pattern next occurs.

FIG. 5b illustrates the resulting structure after a trench mask etch step and a trench etch step. The trench mask etch step etches the trench pattern of about 0.8 uM by 0.8 uM through PSG mask oxide layer 54, nitride-3 layer 44, and pad oxide-3 layer 46 by 100% overetch of CHF$_3$/CF$_4$/He/Ar at about 900 mtorr. A trench etch step etches the trenches of about 6.0 um through P-tank 40 into P type silicon substrate 48 by RIE of SiF$_4$/HBr, at about 100 mtorr.

FIG. 5c shows the resulting structure after a trench mask strip step and a trench wall implant step. The trench mask strip step removes the PSG mask oxide layer 54 and trench wall oxide deposits by deglazing in 10%HF for about 50 seconds followed by a megasonic clean. The trench wall implant step creates the n+ storage node on the trench wall as a shallow junction by forming arsenic layer 50 around the outer walls of the trenches. The copending, and coassigned application Ser. No. 07/622,468 filed on Dec. 5, 1990, now U.S. Pat. No. 5,112,762 incorporated herein by reference, entitled "High Angle Implant To Reduce Gated Diode Leakage" by Anderson, McKee, and Chung describes the preferred method of forming the arsenic layer 50. A low angle implant occurs at approximately 6 degrees tilt with a total dose of approximately $4.0E 15/cm^2$ arsenic occurring through four 90 degree rotations of about $1.0E15/cm^2$ arsenic @100 KeV. A high angle implant occurs at approximately 45 degrees tilt with a total dose of approximately $5.0E14$ /cm$^2$ arsenic occurring through four 90 degree rotations of about $1.25E14/cm^2$ @100 KeV.

FIG. 5d shows the resulting structure following the formation of the gate oxide-1 storage dielectric layer 52 in the trenches and the formation and etchback of the field plate polysilicon capacitor layer 32, poly-1 field plate, over the memory array. In forming the gate oxide-1 layer 52, a nitride deposition step first occurs. About 90 A of nitride, not illustrated, is deposited in the trenches by 1DCS: 10NH$_3$, at 200 mtorr, 800 C. Then, about 580 A of oxide is grown in the trenches by steam oxidation for about 20 minutes at 900 C. This improves the leakage characteristics of gate-1 oxide layer 52 and seals any weak spots in the unillustrated nitride layer. In Situ phosphorus doped deposition of SiH$_4$/TBP, at 400 mtorr and 560 C, forms the poly-1 field plate layer 32 to a thickness of about 6000 A over the silicon substrate 48 and in the trenches 16a and 16b of the memory array. A poly-1 etchback step occurs to thin the poly-1 field plate layer 32 on the surface to about 3500 A by removing about 2500 A in a timed etch of SF$_6$/He at 550 mtorr. This reduces the step height following the field plate etch step below described. FIG. 5d1 presents an enlarged view of the corner of trench 16a.

FIG. 5e shows the resulting structure following patterning of the field plate and etching the field plate to create the field plate openings. Patterning of the filed plate layer 32 occurs by coating, exposing, and developing a positive resist onto the desired areas of the field plate. A two step poly overetch opens the array moat. An isotropic etch using $SF_6$/He at 450 mtorr removes about 2000 A of poly-1. An anisotropic etch using $Cl_1$/He at 425 mtorr removes about 1500 A of poly-1. This produces a beveled corner around the trench edge and removes the poly-1 field plate 32 in the trenches to a depth that is greater than the reach through of the source/drain implant. The resist is then stripped away. FIG. 5e1 presents and enlarged side view of the corner of trench 16a while FIG. 532 presents a top view of the field plate opening 32o.

FIG. 5f shows the resulting structure following the formation of the interlevel oxide, ILO, layer 36 and a field plate edge sidewall nitride layer 58. ILO layer 36 isolates the word lines from the field plate. Steam oxidation at about 800 C grows ILO layer 36 to about 3000 A thick. Field plate edge sidewall nitride deposition occurs by LDCS: $IONH_3$, 200 mtorr, 800 C to form nitride layer 58 to about 1000 A. FIG. 5f1 presents an enlarged side view of the corner of trench 16a. FIG. 5f2 depicts the field plate opening 32o.

FIGS. 5g and 5g1 respectively depict the field plate opening 32o and an enlarged side view representative of a transmission electron microscopy, TEM, photograph of an edge 32e of the field plate opening 32o taken along view 3 following a field plate edge sidewall nitride etch step. The field plate edge sidewall nitride layer 58 and the nitride-3 layer 44 are anisotropically etched with $SF_6$/He at about 250 mtorr, leaving a portion of field plate edge sidewall nitride layer 58 over the ILO layer 36 of the field plate opening 32o.

FIGS. 5h and 5h1 respectively depict the field plate opening 32o and an enlarged TEM side view of an edge 32e of the field plate opening taken along view 3 following a deglaze step. A deglaze step of 1% HF for about 450 seconds substantially removes the pad oxide-3 layer 46 from around the edge of the field plate opening. However, this deglaze step undercuts the pad oxide-3, layer 46 that lies below the nitride-3 layer 44 around the edge of the field plate opening, and forms the undercut 46u. The field plate nitride appears to "dip-out" and over hang the undercut 46u. The nitride dip out over hang is approximately 200 angstroms long. When the polysilicon word lines of the device are later formed, the polysilicon could fill this undercut 46u and thereby provide the basis of the undesirable polysilicon filaments. However, before the formation of the poly-2 word line gates occurs, the advantageous method of preventing filament formation occurs.

In the method of preventing polysilicon filament formation, a dummy gate oxide layer 60 is grown in the field plate openings by steam/HCL oxidation at about 900 C. The dummy gate oxide layer 60 is about 150 angstroms thick and partially fills the under cut area 46u. The oxidation step oxidizes about the first 75 angstroms of P-tank 40 and results in approximately half of dummy gate oxide layer 60 lying within the surface of P-tank 40. A clean oxide surface results. FIG. 5i1 presents an enlarged TEM type view of the edge 32e of the field plate opening 32o taken along view 3 of FIG. 5i following this step.

The advantageous method further continues by thinning the nitride sidewalls 58. The nitride sidewalls 58 are thinned by using a $CF_4$ based chemical dry etch to reduce the dipout and make the sidewall nitride edge approximately coincident with the edge of the undercut area 46u that abutts oxide layer 46. This thinning step also thins nitride-3 layer 44. (An alternative method to thin the nitride sidewalls 58 coincident with the dip out uses a $H_3PO_4$ chemical wet etch.) The dummy gate oxide 60 protects the underlying silicon during the side wall thinning step. The absence of the nitride sidewall overhang helps later to prevent an undesirable polysilicon word line filament from forming in the former undercut area 46u. The dummy gate oxide 60 is then thinned by a deglaze step of 1% HF for about 120 seconds. The deglaze step basically leaves the dummy gate oxide portion in the former undercut area 46u undisturbed while substantially thinning the remaining portion of dummy gate oxide 60 in the field plate openings. The remaining dummy gate oxide 60 along the edge of the field plate openings in the former undercut area 46u helps later to prevent an undesirable polysilicon word line filament from forming. FIG. 5j1 presents an enlarged TEM type view of the edge 32e of the field plate opening 32o taken along view 3 of FIG. 5j following these advantageous steps. Portion 58r within the dotted lines of FIG. 5j1 represents the removed portion of sidewall nitride 58 while portion 44r depicts the removed portion of nitride 44.

The processing steps for manufacturing DRAM 10 further continues with the formation of the gate-2 oxide layer 34. The gate-2 oxide dielectric layer 34 is formed by oxidation of $O_2$/ HCL at about 900 C to a thickness of about 150 A over the exposed silicon areas in the array. FIG. 5k presents a side view of the resulting structure following the above steps while FIG. 5k1 depicts an enlarged view of a corner of trench 16a.

FIG. 5l shows the resulting structure following the addition of a polysilicon layer 14, poly-2, used to form the word lines that also act as the gates of the pass gate transistors. $SiH_4$ at about 250 mtorr, 630 C deposits a layer of poly-2 about 2500 A thick. Phosphorus doping the poly-2 layer 14 by depositing $POCl_3$ at about 875 C introduces a high concentration of phosphorus in the poly-2 layer. A 60 second deglaze in 10% HF removes any residual phosphorus glass. FIG. 5l2 presents an enlarged TEM type view of edge 32e of the field plate opening 32o taken along view 3 of FIG. 5l1.

In FIG. 5m, coating, exposing, and developing a positive photo resist, unillustrated, applies the pattern for etching the poly-2 layer 14. A gate etch step then etches the poly-2 layer 14 to form the gates of the pass gate transistors and the word lines. In the gate etch step, the photoresist is initially stripped away by a Piranha removal and megasonic clean. Then, a 180% gate overetch occurs. By etching with $CF_4$, initially, and then etching with $Cl_2$/HBr at about 300 mtorr, the overetch is accomplished. The unillustrated photoresist is removed by Piranha and a megasonic clean removes any remaining polymers. The gates, word lines, 14 are about 0.6 microns wide. Thereafter, the processing further continues, ultimately yielding the device of DRAM 10.

The advantageous method of eliminating gate filaments on field plate isolated devices partially fills the undercut along the edge of the field plate openings with oxide. This oxide prevents the undercut from being filled with the polysilicon used to form the word lines. When the word lines are patterned, there are no word line polysilicon filaments around the edge of the field plate openings.

An aspect of this invention is that it may be used on other types of double level polysilicon devices using field plate isolation. For instance, it may be used in such a static random access memory (SRAM) device.

While this invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modifications of the embodiments as fall within the true scope and spirit of the invention.

What is claimed is:

1. A method to prevent formation of polysilicon word line filaments along the edges of field plate openings in field plate isolated integrated circuit devices, comprising the steps of:
   forming an oxide layer in the field plate openings beneath a sidewall of nitride along the edges of the field plate openings so that the oxide layer partially fills an undercut beneath a dip out of the sidewall of nitride; and
   removing the dip out of the sidewall of nitride.

2. The method of claim 1 wherein the dip out is removed by etching with chemical dry etch.

3. The method of claim 2 wherein the oxide layer is grown by steam oxidation.

4. The method of claim 3 wherein the field plate isolated integrated circuit device is a dynamic random access memory device.

5. The method of claim 3 wherein the field plate isolated integrated circuit device is a static random access memory device.

6. A method to prevent gate filaments in field plate isolated semiconductor memory devices of the trench capacitor type, comprising the steps of:
   forming an oxide, beneath sidewalls of nitride, in field plate openings, the oxide partially filling an undercut area located beneath the sidewalls of nitride along edges of the field plate openings;
   thinning the sidewalls of nitride so that they do not overhang the undercut area; and
   thinning the oxide formed in the field plate openings, leaving substantially in place the oxide filling the undercut area located beneath the sidewalls of nitride along the edges of the field plate openings.

7. The method to eliminate gate filaments of claim 6 wherein the oxide is formed by steam oxidation.

8. The method to eliminate gate filaments of claim 6 wherein the nitride sidewalls are thinned by chemical dry etch.

9. The method to eliminate gate filaments of claim 6 wherein the nitride sidewalls are thinned by chemical wet etch.

10. The method to eliminate gate filaments of claim 8 wherein the oxide is thinned by deglazing it.

11. A method of making a field plate isolated semiconductor integrated circuit device having field plate openings, comprising the steps of:
    forming a layer of nitride in the field plate openings, the layer of nitride overlying a first etch stop layer of oxide in the field plate openings;
    etching the layer of nitride, leaving sidewalls of nitride along the edges of the field plate openings;
    removing the first etch stop layer of oxide in the field plate openings, the first etch stop layer of oxide having an edge close to the edge of the field plate openings;
    forming a thin second etch stop layer of oxide in the field plate openings;
    etching the sidewalls of nitride so that they are approximately coincident with the edge of the first etch stop layer; and
    substantially removing the thin second etch stop layer from the field plate openings.

12. The method of claim 11 wherein the field plate isolated integrated circuit device is a dynamic random access memory device.

13. A method to remove an undercut region in a nitride over oxide stack structure, comprising the steps of:
    providing a silicon semiconductor surface having a layer of nitride over a layer of oxide, thereby forming a nitride over oxide stack, the nitride over oxide stack having an oxide undercut region wherein the layer of oxide is partially removed so that the layer of nitride overhangs;
    eliminating the oxide undercut region beneath the layer of nitride by forming a thin oxide protection layer to protect an exposed silicon surface, the thin oxide protection layer substantially filling the oxide undercut region;
    etching the layer of nitride to substantially eliminate the nitride overhang; and
    deglazing the thin oxide protection layer while leaving substantially in place the thin oxide protection layer in the undercut region.

14. The method of claim 13 wherein the thin oxide protection layer is formed by steam oxidation.

15. A method of etching a multilayer stack to remove an undercut region, the multilayer stack formed of a first layer overlying a second layer, the first layer having a slower etch rate than the second layer, comprising the steps of:
    etching the first layer, the etching causing a portion of the second layer having a faster etch rate to be removed so that an undercut region is formed beneath the first layer with the first layer extending over the undercut region;
    forming a thin etch stop layer over the second layer, the thin etch stop layer partially filling the undercut region;
    etching the first layer to substantially remove the portion of the first layer extending over the undercut region; and
    etching the thin etch stop layer leaving substantially in place the etch stop layer partially filling the undercut region.

16. The method of claim 15 wherein the first layer is nitride and the second layer is oxide.

17. The method of claim 16 wherein the thin etch stop layer is oxide.

18. The method of claim 17 wherein the step of etching the first layer to substantially remove the portion of the first layer extending over the undercut region is performed by chemical dry etch.

19. The method of claim 17 wherein the step of etching the first layer to substantially remove the portion of the first layer extending over the undercut region is performed by chemical wet etch.

* * * * *